United States Patent [19]
Takayama

[11] Patent Number: 6,049,253
[45] Date of Patent: Apr. 11, 2000

[54] OPERATIONAL AMPLIFIER

[75] Inventor: Tsuyoshi Takayama, Shiga, Japan

[73] Assignee: Matsushita Electric Industrial Co., Ltd., Osaka, Japan

[21] Appl. No.: 09/238,578

[22] Filed: Jan. 28, 1999

[30] Foreign Application Priority Data

Jan. 29, 1998 [JP] Japan ................................. 10-016654

[51] Int. Cl.⁷ ...................................................... H03F 3/45
[52] U.S. Cl. ........................................... 330/255; 330/253
[58] Field of Search .................................. 330/253, 255, 330/261

[56] References Cited

U.S. PATENT DOCUMENTS

| | | | |
|---|---|---|---|
| 4,668,919 | 5/1987 | De Weck | 330/255 |
| 5,289,058 | 2/1994 | Okamoto | 330/253 |
| 5,650,753 | 7/1997 | Ling | 330/255 |
| 5,841,317 | 11/1998 | Ohmori et al. | 330/253 |
| 5,898,341 | 4/1999 | Miyashita | 330/253 |
| 5,909,146 | 6/1999 | Okada | 330/255 |

FOREIGN PATENT DOCUMENTS 9-219629  8/1997  Japan .

*Primary Examiner*—Robert Pascal
*Assistant Examiner*—Khanh Van Nguyen
*Attorney, Agent, or Firm*—Eric J. Robinson; Nixon Peabody LLP

[57] ABSTRACT

Both the distortion characteristic and the through rate characteristic of an operational amplifier are excellently retained over a wide range of a supply voltage. While an operating current of a differential circuit is controlled by a first current source circuit, an operating current of a level shift circuit is controlled by a second current source circuit. The first current source circuit controls the operating current to be substantially constant against a change of the supply voltage, so that the through rate characteristic of the operational amplifier can be good over a predetermined range of the supply voltage. The second current source circuit controls the operating current so that a difference between the supply voltage and a level shift voltage can be substantially constant against the change of the supply voltage so as not to degrade the distortion characteristic of the operational amplifier over the predetermined range of the supply voltage. As a result, the distortion characteristic and the through rate characteristic of the operational amplifier can be excellently retained over a wide range of the supply voltage.

20 Claims, 5 Drawing Sheets

OPERATIONAL AMPLIFIER

BACKGROUND OF THE INVENTION

The present invention relates to an operational amplifier, and more particularly, it relates to a technique to stabilize the characteristics of an operational amplifier over a wide range of a supply voltage.

FIG. 6 illustrates an exemplified circuit configuration of a conventional operational amplifier. The operational amplifier of FIG. 6 includes a differential circuit 10, a level shift circuit 20, an output circuit 30 and a bias current source circuit 40.

In the differential circuit 10, a differential input transistor 11 changes differential currents Idf1 and Idf2 in accordance with a voltage difference between input signals SI1 and SI2. At this point, the sum of the differential currents Idf1 and Idf2 always accords with an operating current Idiff flowing through a differential current source transistor 13. Furthermore, an active load transistor 12 changes an output signal Sa of the differential circuit 10 in accordance with a difference between the differential currents Idf1 and Idf2.

The level shift circuit 20 shifts the output signal Sa of the differential circuit 10 by a voltage corresponding to the gate voltage V1 of a level shift transistor 21, so as to output the resultant signal as a signal Sb. This level shift voltage V1 depends upon an operating current Ils flowing through a level shift current source transistor 22.

The output circuit 30 has a push-pull configuration including a p-type first output stage transistor 31 and an n-type second output stage transistor 32. The first output stage transistor 31 receives, at its gate, the output signal Sa of the differential circuit 10, and the second output stage transistor 32 receives, at its gate, the output signal Sb of the level shift circuit 20. The signals Sa and Sb are respectively amplified by the first and second output stage transistors 31 and 32, resulting in outputting a signal SO as an output signal of the operational amplifier.

The bias current source circuit 40 supplies a voltage Vg, which is obtained by dividing the supply voltage with resistors 41 and 42, as the gate voltage of the differential current source transistor 13 and the level shift current source transistor 22.

In the case where a high frequency pulse signal, such as a PWM modulated audio signal, is used as an input signal to the operational amplifier, the operational amplifier is required to have a low distortion rate and a high through rate. According to examination made by the present inventor, however, it has been found that the conventional operational amplifier having the configuration as is shown in FIG. 6 cannot always exhibit good characteristics when the supply voltage is changed in a wide range, for example, between 3 V and 5 V.

First, the distortion characteristic of an operational amplifier will be examined.

FIG. 7 is a graph for showing the Ids-Vds characteristic of a transistor. In FIG. 7, Vds indicates a drain-source voltage, Ids indicates a drain current, Vgs indicates a gate-source voltage (gate voltage), and Vt indicates a threshold voltage. As is shown in FIG. 7, as the gate voltage Vgs of the transistor is increased, the range of the drain-source voltage Vds included in an unsaturation region is increased (Va<Vb<Vc), and the range of the drain-source voltage Vds included in a saturation region where the Vds-Ids characteristic linearly changes is decreased. Accordingly, when the gate voltages Vgp and Vgn of the output stage transistors 31 and 32 are increased, the ranges of their drain-source voltages Vds included in the saturation region are narrowed. As a result, a range of a voltage where the signal SO can be output without distortion is accordingly narrowed. In other words, as the gate voltages Vgp and Vgn of the output stage transistors 31 and 32 are higher, the output signal SO can be more easily distorted.

Therefore, in view of the distortion characteristic of an operational amplifier, it is desired that, when the supply voltage is changed, the level shift voltage V1 is similarly changed so as not to largely change the gate voltages Vgp and Vgn of the output stage transistors 31 and 32. Since the level shift voltage V1 depends upon the operating current Ils of the level shift circuit 20, in order to retain a good distortion characteristic over a wide range of the supply voltage, it is necessary to largely change the operating current Ils of the level shift circuit 20 in accordance with the change of the supply voltage.

For example, in order to set the gate voltages Vgp and Vgn of the output stage transistors 31 and 32 at 1 V, when the supply voltage is 5 V, the level shift voltage V1 is required to be set at 3 (=5−1−1) V and when the supply voltage is 3 V, the level shift voltage V1 is required to be set at 1 (=3−1−1) V. On the other hand, the following relationship holds:

$$Ids = K(Vgs - Vt)^2$$

wherein K is a constant depending upon the size of a transistor. Therefore, in order to change the level shift voltage V1 from 1 V to 3 V, it is necessary to change the operating current Ils of the level shift circuit 20 from $K(3-Vt)^2$ to $K(1-Vt)^2$. When the threshold voltage Vt is assumed to be 0.8 V, it is necessary to change the operating current Ils of the level shift circuit 20 in a wide range from 4.84 K to 0.04 K.

Next, the through rate characteristic of an operational amplifier will be examined.

As a result of experiments made by the present inventor, it has been found that the through rate of an operational amplifier is higher as the operating current Idiff of the differential circuit 10 is larger. In particular, when a signal with a small pulse width is used as an input signal, the operating current Idiff is preferably sufficiently increased so that the edge of an output signal can be steep enough for the pulse not to collapse. On the other hand, when the operating current Idiff is large, the gate voltages of the transistors included in the differential circuit 10 are accordingly increased. Therefore, if the operating circuit Idiff is excessively increased, there is a possibility that the differential circuit 10 cannot be normally operated when the supply voltage is low.

Accordingly, in view of the through rate characteristic, it is necessary to set the operating current Idiff so as to obtain a desired through rate within a range where the differential circuit 10 can be normally operated. For example, the operating current Idiff is preferably controlled to be substantially constant regardless of the supply voltage.

However, in the conventional operational amplifier of FIG. 6, the voltage Vg generated by the bias current source circuit 40 is supplied to both the differential current source transistor 13 and the level shift current source transistor 22 as their gate voltages, and the operating current Idiff of the differential circuit 10 and the operating current Ils of the level shift circuit 20 are commonly controlled by the bias current source circuit 40. Accordingly, it is difficult to attain both a good distorting characteristic and a good through rate characteristic over a wide range of the supply voltage.

Specifically, in order to attain a good distortion characteristic, it is necessary to set the resistance values of the resistors 41 and 42 of the bias current source circuit 40 in consideration of the operating current Ils of the level shift circuit 20. In this case, however, the operating current Idiff cannot always have an appropriate magnitude over the wide range of the supply voltage, and hence, the through rate characteristic can be degraded. On the other hand, in order to attain a good through rate characteristic, it is necessary to set the resistance values of the resistors 41 and 42 of the bias current source circuit 40 in consideration of the operating current Idiff of the differential circuit 10. In this case, however, the operating current Ils of the level shift circuit 20 cannot always have an appropriate magnitude over the wide range of the supply voltage. Therefore, the distortion characteristic can be degraded, and in particular, when the supply voltage is high, the distortion characteristic can be more likely to be degraded.

Moreover, when the resistance values of the resistors 41 and 42 are set in the bias current source circuit 40 so that the voltage Vg can be relatively low, the voltage Vg is decreased to be lower than the threshold voltage Vt of the current source transistors 13 and 22 as the supply voltage is decreased. As a result, there is a possibility that the operational amplifier itself cannot be operated. Alternatively, in the case where the resistance values of the resistors 41 and 42 are set so that the voltage Vg can be relatively high, when the input signals SI1 and SI2 have low DC voltage levels, the differential current source transistor 13 is included in the unsaturation region because the source-drain voltage thereof becomes smaller than a value obtained by subtracting the threshold voltage from the gate voltage (Vds<Vgs−Vt). As a result, the distortion characteristic can be degraded.

SUMMARY OF THE INVENTION

The object of the present invention is, in an operational amplifier, retaining both a good distortion characteristic and a good through rate characteristic even when a supply voltage is changed in a predetermined range.

Specifically, the operational amplifier of this invention comprises a differential circuit for receiving a first signal and a second signal and outputting a signal obtained in accordance with a potential difference between the first signal and the second signal; a level shift circuit for shifting an output signal of the differential circuit; an output circuit including a first output stage transistor receiving, at a gate thereof, the output signal of the differential signal, and a second output stage transistor serially connected with the first output stage transistor for receiving, at a gate thereof, an output signal of the level shift circuit; a first current source circuit for controlling an operating current of the differential circuit; and a second current source circuit for controlling an operating current of the level shift circuit, wherein the first current source circuit and the second current source circuit are independently separated circuits.

According to the present invention, the first current source circuit for controlling the operating current of the differential circuit and the second current source circuit for controlling the operating current of the level shift circuit are independent of each other. Therefore, while the first current source circuit controls the operating current of the differential circuit so as to attain a good through rate characteristic over a predetermined range of a supply voltage, the second current source circuit controls the operating current of the level shift circuit so as not to degrade the distortion characteristic over the predetermined range of the supply voltage. In other words, the operating current of the differential circuit and the operating current of the level shift circuit can be independently and properly controlled against a change of the supply voltage. Therefore, both the distortion characteristic and the through rate characteristic of the operational amplifier can be excellently retained over a wide range of the supply voltage.

The first and second current source circuits are preferably constructed in a manner that the operating current of the differential circuit is less varied in accordance with a change of a supply voltage than the operating current of the level shift circuit.

Furthermore, in the operational amplifier, the first current source circuit preferably controls the operating current of the differential circuit to be substantially constant against the change of the supply voltage. In this manner, the operating current of the differential circuit can be retained substantially constant against the change of the supply voltage by the first current source circuit. Therefore, the through rate characteristic of the operational amplifier can be excellently retained over a wide range of the supply voltage without degrading the distortion characteristic.

Preferably, the first current source circuit includes a first reference transistor mirror-connected with a differential current source transistor where the operating current flows in the differential circuit and controls a first reference current flowing through the first reference transistor.

Furthermore, the first reference transistor is preferably serially connected with a resistor between a power supply and ground. In addition, the first reference transistor is preferably serially connected with a resistor, and the first reference transistor and the resistor serially connected with each other are preferably supplied, at ends thereof, with a predetermined voltage generated by a constant voltage source. Moreover, the first reference transistor is preferably serially connected, between a power supply and ground, with a transistor for receiving, at a gate thereof, a potential obtained by dividing a supply voltage with a resistor.

In the operational amplifier, the second current source circuit preferably controls the operating current of the level shift circuit in a manner that a difference between a supply voltage and a level shift voltage is substantially constant against a change of the supply voltage. In this manner, the operating current of the level shift circuit can be controlled so that the difference between the supply voltage and the level shift voltage can be substantially constant against the change of the supply voltage by the second current source circuit. Therefore, the distortion characteristic of the operational amplifier can be excellently retained over a wide range of the supply voltage.

Preferably, the level shift circuit includes a level shift current source transistor where the operating current flows; and a level shift transistor for generating a level shift voltage in accordance with the operating current, and the second current source circuit includes a second reference transistor mirror-connected with the level shift current source transistor and controls a second reference current flowing through the second reference transistor.

Furthermore, the second reference transistor is preferably formed from a transistor of the same conductivity type as the level shift transistor. In addition, the second reference transistor preferably has substantially the same size as the level shift transistor.

Preferably, the second current source circuit includes diode-connected two transistors and a resistor disposed serially between a power supply and ground, and the second reference transistor is supplied, as a gate voltage, with a voltage at ends of the resistor. In addition, the diode-connected two transistors preferably respectively have substantially the same sizes as the first output stage transistor and the second output stage transistor.

Preferably, the second current source circuit includes a constant voltage source, and the second reference transistor is supplied, as a gate voltage, with a voltage corresponding to a difference between a supply voltage and a predetermined voltage generated by the constant voltage source.

Also preferably, the second current source circuit includes diode-connected two transistors and a constant current source serially disposed between a power supply and ground, and the second reference transistor is supplied, as a gate voltage, with a voltage at ends of the constant current source. In addition, the diode-connected two transistors preferably respectively have substantially the same sizes as the first output stage transistor and the second output stage transistor.

DETAILED DESCRIPTION OF THE INVENTION

An operational amplifier according to an embodiment of the invention will now be described with reference to the accompanying drawings.

Figure 1:
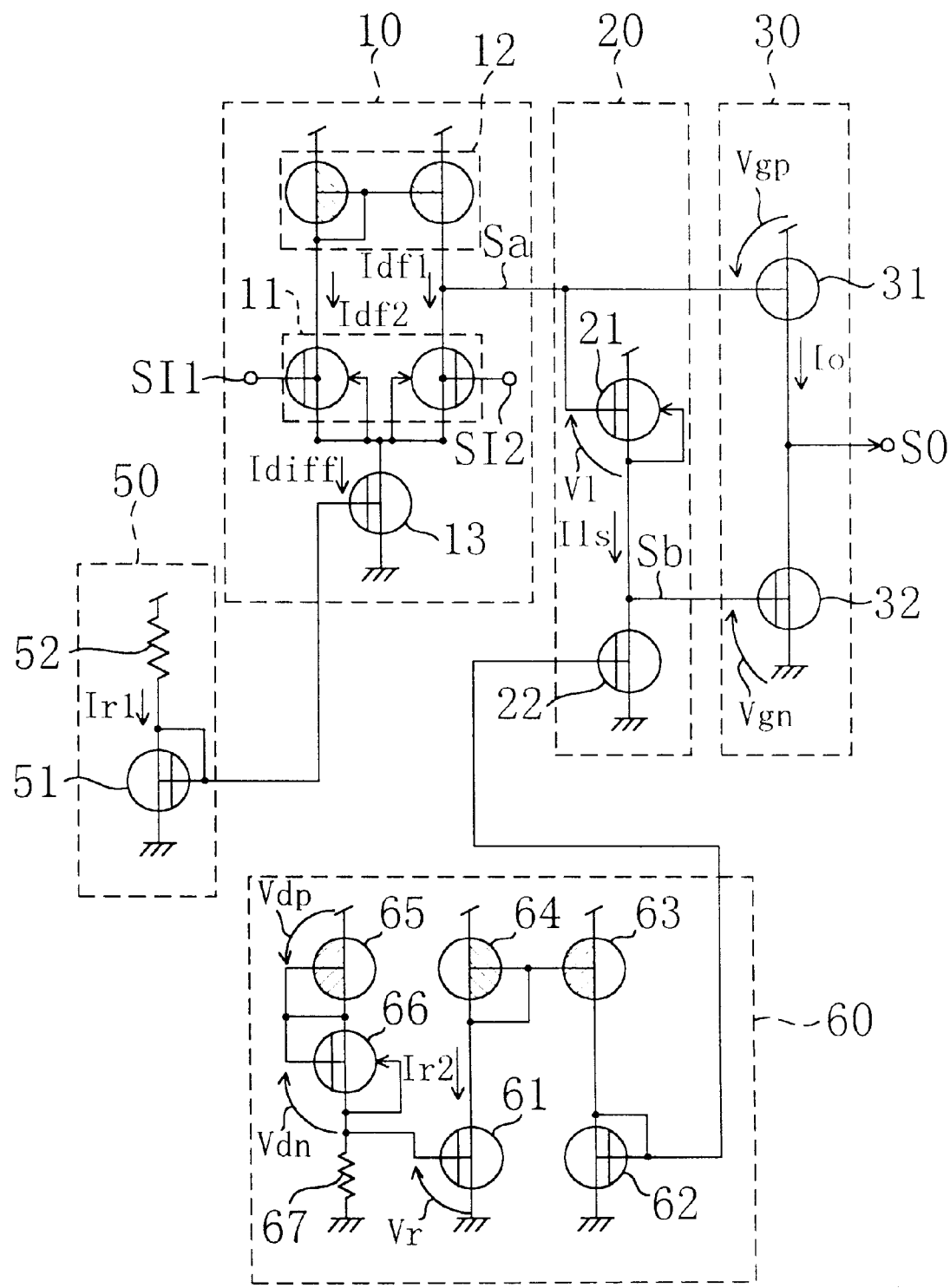
FIG. 1 is a diagram for showing the circuit configuration of an operational amplifier according to an embodiment of the invention.

FIG. 1 is a diagram for showing the circuit configuration of the operational amplifier of this embodiment. In FIG. 1, a reference numeral 10 denotes a differential circuit for receiving a first signal SI1 and a second signal SI2 and outputting a signal Sa obtained in accordance with a potential difference between the signals SI1 and SI2, a reference numeral 20 denotes a level shift circuit for shifting the amplitude the output signal Sa of the differential circuit 10 and outputting the resultant signal as a signal Sb, and a reference numeral 30 denotes an output circuit for receiving the output signal Sa of the differential circuit 10 and the output signal Sb of the level shift circuit 20 and outputting a signal SO as an output signal of the operational amplifier.

In the differential circuit 10, a differential input transistor 11 changes differential currents Idf1 and Idf2 in accordance with a voltage difference between the signals SI1 and SI2. At this point, the sum of the differential currents Idf1 and Idf2 always accords with an operating current Idiff flowing through a differential current source transistor 13. An active load transistor 12 changes the output signal Sa of the differential circuit 10 in accordance with a difference between the differential currents Idf1 and Idf2.

The level shift circuit 20 shifts the output signal Sa of the differential circuit 10 by a voltage V1 corresponding to the gate voltage of a level shift transistor 21, and outputs the resultant signal as the signal Sb. This level shift voltage V1 depends upon an operating current Ils flowing through a level shift current source transistor 22.

The output circuit 30 includes a p-type first output stage transistor 31 and an n-type second output stage transistor 32 serially connected between the power supply and the ground, so that the signal SO can be output from a node between the drains of the first and second output stage transistors 31 and 32. The first output stage transistor 31 receives, at its gate, the output signal Sa of the differential circuit 10, and the second output stage transistor 32 receives, at its gate, the output signal Sb of the level shift circuit 20.

Also in FIG. 1, a reference numeral 50 denotes a first current source circuit for controlling the operating current Idiff of the differential circuit 10 and a reference numeral 60 denotes a second current source circuit for controlling the operating current Ils of the level shift circuit 20, and these current source circuits are independent of each other.

The first current source circuit 50 includes a diode-connected first reference transistor 51, which is mirror-connected with the differential current source transistor 13 of the differential circuit 10. Wherein, the "mirror-connection" in this specification means the state that the transistors compose a mirror circuit or the transistors are connected with each other through one or plural stages of mirror transistors. Also, the first reference transistor 51 is serially connected with a resistor 52 between the power supply and the ground.

The second current source circuit 60 includes a second reference transistor 61, which is mirror-connected with the level shift current source transistor 22 of the level shift circuit 20 through mirror transistors 62, 63 and 64. Also, the second current source circuit 60 includes diode-connected two transistors 65 and 66 and a resistor 67 serially connected between the power supply and the ground. A voltage at the end of the resistor 67 is supplied as a gate voltage Vr of the second reference transistor 61.

The operational amplifier having the configuration as is shown in FIG. 1 has the following features:

First, in the operational amplifier of FIG. 1, the first current source circuit 50 and the second current source circuit 60 are independent and separate circuits. Since the operating current Idiff of the differential circuit 10 and the operating current Ils of the level shift circuit 20 can be independently controlled by using these two circuits, the distortion characteristic and the through rate characteristic of the operational amplifier can be both excellently retained even when the supply voltage is changed.

In addition, the first and second current source circuits 50 and 60 are constructed so that the operating current can be less varied in accordance with the change of the supply voltage in the differential circuit 10 than in the level shift circuit 20.

The first current source circuit 50 is constructed so that the operating current Idiff of the differential circuit 10 can be stabilized at a substantially constant value against the change of the supply voltage. Specifically, since the first reference transistor 51 and the differential current source transistor 13 are mirror-connected, the gate voltage of the differential current source transistor 13 cannot be varied in accordance with the change of the supply voltage. Furthermore, since a first reference current Ir1 flowing through the first reference transistor 51 is set by using the resistor 52, the operating current Idiff of the differential circuit 10 can be less varied in accordance with the change of the supply voltage.

On the other hand, the second current source circuit 60 controls the operating current Ils of the level shift circuit 20 so that a difference between the supply voltage and the level shift voltage V1 can be substantially constant against the change of the supply voltage. In other words, the second current source circuit 60 controls the operating current Ils of the level shift circuit 20 so that the sum of the gate voltages of the first and second output stage transistors 31 and 32 of the output circuit 30 (i.e., a voltage (Vgp+Vgn)) can be substantially constant against the change of the supply voltage.

At this point, when it is assumed that a mirror circuit including the level shift current source transistor 22 and the mirror transistors 62, 63 and 64 has a mirror ratio of 1, the operating current Ils of the level shift circuit 20 is equal to a second reference current Ir2 flowing through the second reference transistor 61. Also, the second reference transistor 61 is formed from a transistor of the same conductivity type and has substantially the same size as the level shift transistor 21 of the level shift circuit 20. In this manner, the level shift voltage V1 can be substantially equal to the gate voltage Vr of the second reference transistor 61.

The second reference transistor 61 is supplied with the voltage at the end of the resistor 67 as the gate voltage Vr. In other words, the voltage Vr is obtained by subtracting a constant voltage obtained by the two diode-connected transistors 65 and 66 (i.e., a voltage (Vdp+Vdn)) from the supply voltage. Accordingly, the difference between the supply voltage and the level shift voltage V1 corresponds to a difference between the supply voltage and the voltage Vr, namely, the voltage (Vdp+Vdn).

As a result, the sum of the gate voltages of the first and second output stage transistors 31 and 32 of the output circuit 30 (i.e., the voltage (Vgp+Vgn)) is equal to the voltage at the ends of the two transistors 65 and 66 of the second current source circuit 60 (i.e., the voltage (Vdp+Vdn)). Accordingly, the sum of the gate voltages can be constant regardless of the supply voltage.

Furthermore, the second reference transistor 61 and the level shift transistor 21 include transistors of the same conductivity type (the n-type in this embodiment). Therefore, the voltage Vr is always equal to the level shift voltage V1 regardless of the threshold voltage Vt. Accordingly, even when the threshold voltages Vt of the transistors are varied due to fluctuation in processes, the sum of the gate voltages of the first and second output stage transistors 31 and 32 (i.e., the voltage (Vgp+Vgn)) can be substantially constant without being affected by the variation of the threshold voltages Vt.

Moreover, the diode-connected transistors 65 and 66 preferably have substantially the same sizes as the first and second output stage transistors 31 and 32, respectively. In this manner, even when the threshold voltages Vt of the transistors are varied due to manufacturing processes, an operating current Io flowing trough the first and second output stage transistors 31 and 32 can be substantially constant in each operational amplifier without being affected by the variation of the threshold voltages Vt.

(Other configurations of the first current source circuit)

Figure 2:
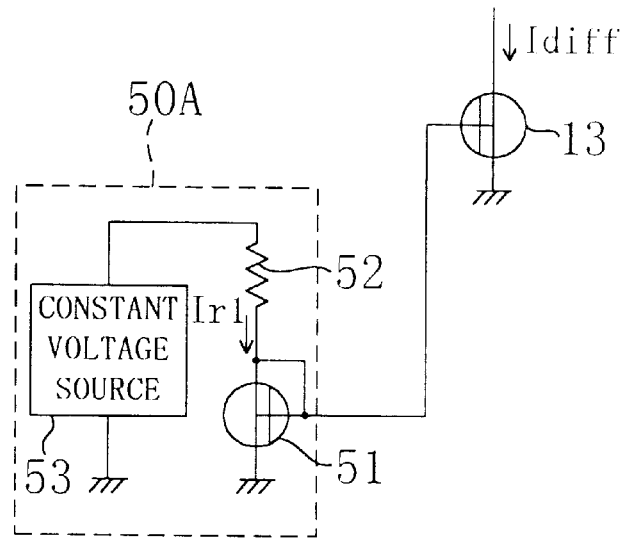
FIG. 2 is a diagram for showing another configuration of a first current source circuit of the operational amplifier of FIG. 1.

FIG. 2 shows another circuit configuration of the first current source circuit. A first current source circuit 50A of FIG. 2 is constructed so that a resistor 52 can be pulled up by a constant voltage source 53 including a bandgap power source or the like. Specifically, a first reference transistor 51 and the resistor 52 serially connected are supplied at their ends with a predetermined voltage generated by the constant voltage source 53. When such a configuration is adopted, the magnitude of the first reference current Ir1 can be made constant regardless of the supply voltage, and hence, the magnitude of the operating current Idiff of the differential circuit can be always constant.

Figure 3:
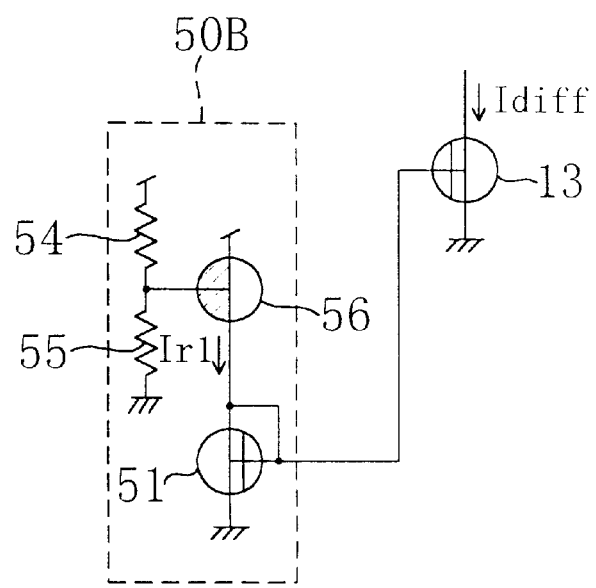
FIG. 3 is a diagram for showing still another configuration of the first current source circuit of the operational amplifier of FIG. 1.

FIG. 3 shows still another circuit configuration of the first current source circuit. A first current source circuit 50B of FIG. 3 includes a first reference transistor 51 serially connected, between the power supply and the ground, with a p-type transistor 56 receiving, at its gate, a potential obtained by dividing the supply voltage with resistors 54 and 55. When such a configuration is adopted, the first reference current Ir1 is changed in accordance with the gate voltage of the p-type transistor 56. Therefore, the operating current Idiff of the differential circuit 10 is relatively decreased when the supply voltage is lower, and is relatively increased when the supply voltage is higher. Accordingly, the gate voltage of the differential current source transistor 13 can be prevented from exceeding the drain-source voltage when the supply voltage is low. As a result, while retaining the normal operation of the differential circuit 10 even when the supply voltage is low, the through rate characteristic of the operational amplifier can be excellently retained over a wide range of the supply voltage.

(Other configurations of the second current source circuit)

Figure 4:
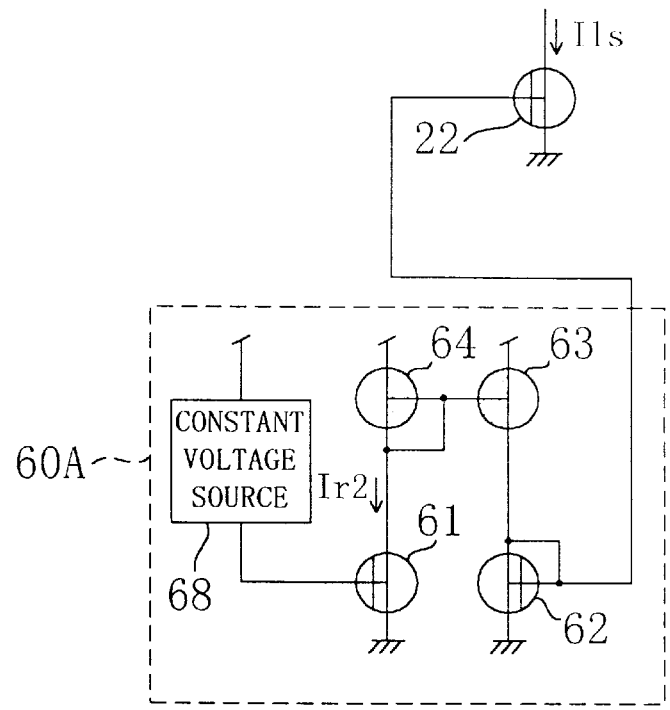
FIG. 4 is a diagram for showing another configuration of a second current source circuit of the operational amplifier of FIG. 1.

FIG. 4 shows another circuit configuration of the second current source circuit. A second current source circuit 60A of FIG. 4 is provided with a constant voltage source 68 including a bandgap power supply or the like, so that a voltage corresponding to a difference between the supply voltage and a predetermined voltage generated by the constant voltage source 68 can be supplied to a second reference transistor 61 as the gate voltage.

In the second current source circuit 60 of FIG. 1, the diode-connected transistors 65 and 66 together simply form a constant voltage source. In this case, when the supply voltage is changed in actual use, the voltage at the ends of the transistors 65 and 66 (i.e., the voltage (Vdp+Vdn)) can be slightly changed. Accordingly, the gate voltages of the first and second output stage transistors 31 and 32 can be slightly changed in accordance with the change of the supply voltage.

In contrast, in the configuration shown in FIG. 4, the second reference transistor 61 is always supplied with the gate voltage corresponding to a voltage obtained by subtracting the voltage generated by the constant voltage source 68 from the supply voltage. Accordingly, the gate voltages of the first and second output stage transistors 31 and 32 can be always constant regardless of the supply voltage.

Figure 5:
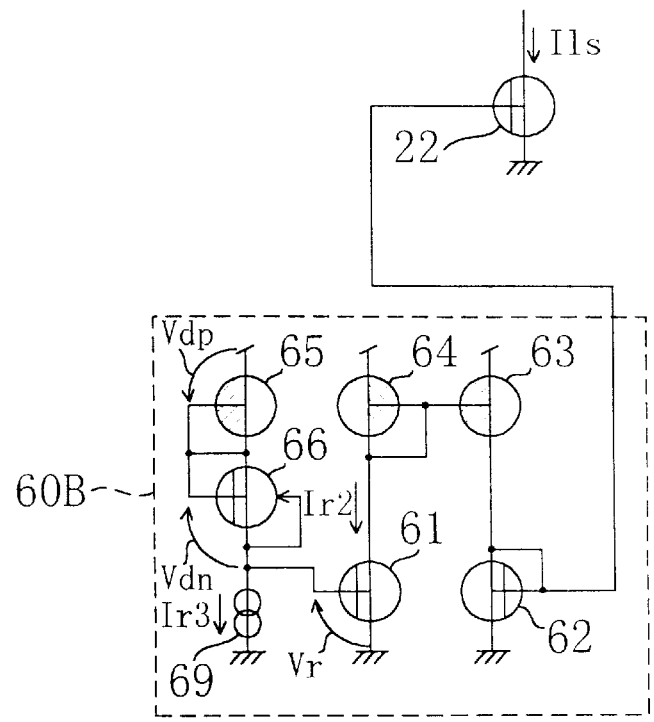
FIG. 5 is a diagram for showing still another configuration of the second current source circuit of the operational amplifier of FIG. 1.
Figure 6:
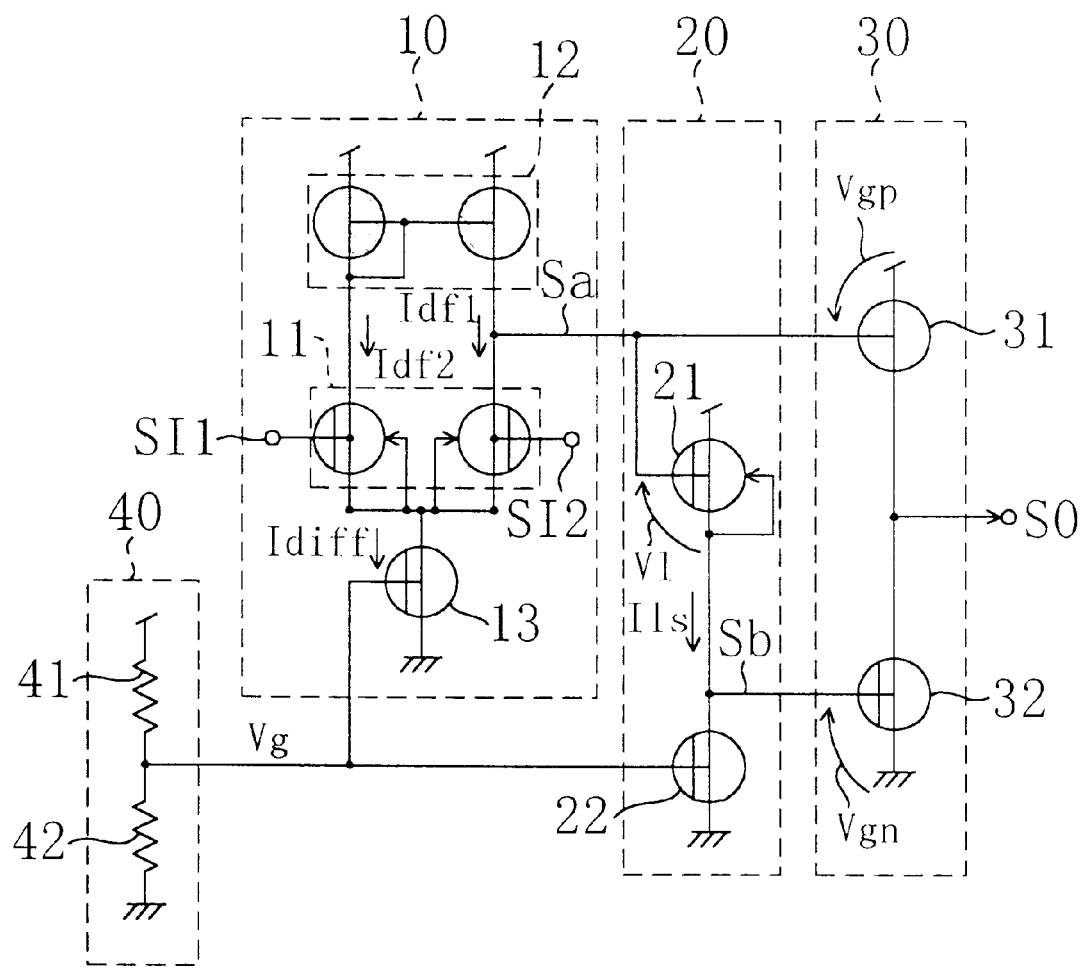
FIG. 6 is a diagram for showing an exemplified circuit configuration of a conventional operational amplifier.

FIG. 5 shows still another circuit configuration of the second current source circuit. A second current source circuit 60B of FIG. 5 includes diode-connected two transistors 65 and 66 and a constant current source 69 serially connected between the power supply and the ground, so that the voltage at the end of the constant current source 69 can be supplied to a second reference transistor 61 as the gate voltage. In other words, the second current source circuit 60B of FIG. 5 can be obtained by replacing the resistor 67 with the constant current source 69 in the second current source circuit 60 of FIG. 1. The transistors 65 and 66 respectively have substantially the same sizes as the first and second output stage transistors 31 and 32.

In the second current source circuit 60 of FIG. 1, the gate voltages of the first and second output stage transistors 31 and 32 are slightly changed in accordance with the change of the supply voltage as described above. On the other hand, in the second current source circuit 60A of FIG. 4, although the sum of the gate voltages of the first and second output stage transistors 31 and 32 (i.e., the voltage (Vgp+Vgn)) can be always constant, the operating current Io of the output circuit 30 can be varied due to fluctuation of the threshold voltages Vt of the transistors.

Figure 7:
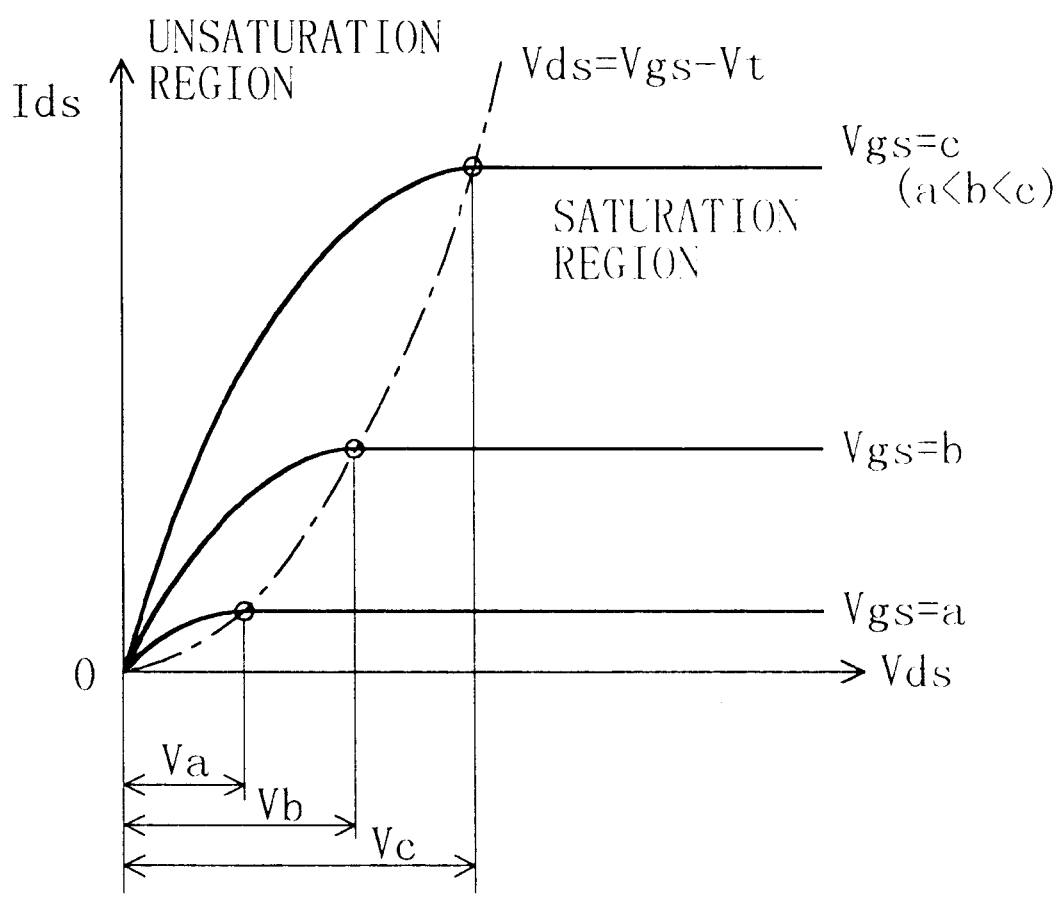
FIG. 7 is a graph for showing the Ids-Vds characteristic of a transistor.

For example, in the case where the threshold voltages Vt are varied to Vt' (Vt >Vt'), in a characteristic of the transistor shown in FIG. 7, when the gate voltage Vgs is constant, the source-drain voltage Vds(sat) for limiting a saturation region is changed from (Vgs−Vt) to (Vgs−Vt'), with a result of the saturation region narrowed. This involves a disadvantage that the output signal SO is liable to be distorted.

In contrast, in the configuration shown in FIG. 5, even when the threshold voltages Vt of the transistors are fluctuated due to manufacturing processes, the operating current Io of the output circuit 30 and a constant current Ir3 flowing through the constant current source 69 can always accord with each other. Accordingly, the distortion characteristic of the operational amplifier cannot be affected by the fluctuation in the processes, and can be excellently retained over a wide range of the supply voltage.

This effect may be explained as follows: For example, when the threshold voltages Vt are varied to Vt' (Vt>Vt'), $$Ids = K(Vgs - Vt)^2 = K(Vgs' - Vt')^2$$
$$\therefore Vgs' = Vgs - Vt + Vt'$$

because the drain current Ids is constant. Accordingly, the gate voltage Vgs is changed to the voltage Vgs' in the above equation. Thus, $$Vds'(sat) = Vgs' - Vt'$$
$$= (Vgs - Vt + Vt') - Vt'$$
$$= Vgs - Vt = Vds(sat)$$

with a result of no change of the saturation region. Therefore, no distortion of the output signal SO is caused.

Although the conductivity type of the differential input transistor 11, the differential current source transistor 13, the level shift transistor 21 and the level shift current source transistor 22 is an n-type in the aforementioned embodiment, the operational amplifier can be obtained in a configuration where the n-type transistors are exchanged with p-type transistors and the power supply is exchanged with the ground.

As described so far, the operating current of the differential circuit and the operating current of the level shift circuit can be independently and properly controlled against a change of the supply voltage in this invention. Accordingly, both the distortion characteristic and the through rate characteristic of the operational amplifier can be excellently retained over a wide range of the supply voltage.

Moreover, since the operating current of the differential circuit is substantially constantly retained against a change of the supply voltage, the through rate characteristic of the operational amplifier can be satisfactorily retained over a wide range of the supply voltage without degrading the distortion characteristic. In addition, since the operating current of the level shift circuit is controlled so that a difference between the supply voltage and a level shift voltage can be substantially constant against a change of the supply voltage, the distortion characteristic of the operational amplifier can be satisfactorily retained over a wide range of the supply voltage without degrading the through rate characteristic.

What is claimed is:

1. An operational amplifier comprising:

a differential circuit for receiving a first signal and a second signal and outputting a signal obtained in accordance with a potential difference between said first signal and said second signal;

a level shift circuit for shifting an output signal of said differential circuit;

an output circuit including a first output stage transistor receiving, at a gate thereof, said output signal of said differential circuit, and a second output stage transistor serially connected with said first output stage transistor for receiving, at a gate thereof, an output signal of said level shift circuit;

a first current source circuit for controlling an operating current of said differential circuit; and a second current source circuit for controlling an operating current of said level shift circuit, wherein said first current source circuit and said second current source circuit are independently separated circuits.

2. The operational amplifier of claim 1, wherein said first and second current source circuits are constructed in a manner that said operating current of said differential circuit is less varied in accordance with a change of a supply voltage than said operating current of said level shift circuit.

3. The operational amplifier of claim 1, wherein said first current source circuit controls said operating current of said differential circuit to be substantially constant against a change of a supply voltage.

4. The operational amplifier of claim 1, wherein said differential circuit includes a differential current source transistor where said operating current flows, and said first current source circuit includes a first reference transistor mirror-connected with said differential current source transistor and controls a first reference current flowing through said first reference transistor.

5. The operational amplifier of claim 4, wherein said first reference transistor is serially connected with a resistor between a power supply and ground.

6. The operational amplifier of claim 4, wherein said first reference transistor is serially connected with a resistor, and said first reference transistor and said resistor serially connected with each other are supplied, at ends thereof, with a predetermined voltage generated by a constant voltage source.

7. The operational amplifier of claim 4, wherein said first reference transistor is serially connected, between a power supply and ground, with a transistor for receiving, at a gate thereof, a potential obtained by dividing a supply voltage with a resistor.

8. The operational amplifier of claim 1, wherein said second current source circuit controls said operating current of said level shift circuit in a manner that a difference between a supply voltage and a level shift voltage is substantially constant against a change of the supply voltage.

9. The operational amplifier of claim 8,
wherein said level shift circuit includes:
 a level shift current source transistor where said operating current flows; and
 a level shift transistor for generating a level shift voltage in accordance with said operating current,
said second current source circuit includes:
 a second reference transistor mirror-connected with said level shift current source transistor; and
 a constant voltage source, and
said second reference transistor is supplied, as a gate voltage, with a voltage corresponding to a difference between a supply voltage and a predetermined voltage generated by said constant voltage source.

10. The operational amplifier of claim 1,
wherein said second current source circuit controls said operating current of said level shift circuit in a manner that a current flowing through said first and second output stage transistors is substantially constant against a change of the supply voltage.

11. The operational amplifier of claim 10,
wherein said level shift circuit includes:
 a level shift current source transistor where said operating current flows; and
 a level shift transistor for generating a level shift voltage in accordance with said operating current,
said second current source circuit includes:
 a second reference transistor mirror-connected with said level shift current source transistor;
 diode-connected two transistors and a constant current source serially disposed between a power supply and ground, and
said second reference transistor is supplied, as a gate voltage, with a voltage at ends of said constant current source.

12. The operational amplifier of claim 1,
wherein said level shift circuit includes:
 a level shift current source transistor where said operating current flows; and
 a level shift transistor for generating a level shift voltage in accordance with said operating current, and
said second current source circuit includes a second reference transistor mirror-connected with said level shift current source transistor, and controls a second reference current flowing through said second reference transistor.

13. The operational amplifier of claim 12,
wherein said second reference transistor is formed from a transistor of the same conductivity type as said level shift transistor.

14. The operational amplifier of claim 13,
said second reference transistor has substantially the same size as said level shift transistor.

15. The operational amplifier of claim 12,
wherein said second current source circuit includes diode-connected two transistors and a resistor disposed serially between a power supply and ground, and
said second reference transistor is supplied, as a gate voltage, with a voltage at ends of said resistor.

16. The operational amplifier of claim 15,
wherein said diode-connected two transistors are formed from transistors of the same conductivity type and have substantially the same sizes as said first output stage transistor and said second output stage transistor, respectively.

17. The operational amplifier of claim 12,
wherein said second current source circuit includes a constant voltage source, and
said second reference transistor is supplied, as a gate voltage, with a voltage corresponding to a difference between a supply voltage and a predetermined voltage generated by said constant voltage source.

18. The operational amplifier of claim 12,
wherein said second current source circuit includes diode-connected two transistors and a constant current source serially disposed between a power supply and ground, and
said second reference transistor is supplied, as a gate voltage, with a voltage at ends of said constant current source.

19. The operational amplifier of claim 18,
wherein said diode-connected two transistors are formed from transistors of the same conductivity type and have substantially the same sizes as said first output stage transistor and said second output stage transistor, respectively.

20. The operational amplifier of claim 18,
wherein said second current source circuit controls said constant current source in a manner that the current value thereof is equal to a current flowing through said first and second output stage transistors.

* * * * *